US012753528B2

(12) United States Patent
Uematsu

(10) Patent No.: US 12,753,528 B2
(45) Date of Patent: Oct. 6, 2026

(54) SILICON CARBIDE SINGLE CRYSTAL MANUFACTURING APPARATUS, COMPUTING DEVICE, AND MANUFACTURING METHOD OF SILICON CARBIDE SINGLE CRYSTAL

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Daisuke Uematsu, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 250 days.

(21) Appl. No.: 18/777,952

(22) Filed: Jul. 19, 2024

(65) Prior Publication Data

US 2025/0092569 A1 Mar. 20, 2025

(30) Foreign Application Priority Data

Sep. 19, 2023 (JP) ................................ 2023-151432

(51) Int. Cl.
*C30B 25/12* (2006.01)
*C30B 25/16* (2006.01)
(Continued)

(52) U.S. Cl.
CPC .............. *C30B 29/36* (2013.01); *C30B 25/12* (2013.01); *C30B 25/16* (2013.01); *C30B 35/002* (2013.01)

(58) Field of Classification Search
CPC ....... C30B 25/12; C30B 25/16; C30B 35/002; C30B 29/36
See application file for complete search history.

(56) References Cited

U.S. PATENT DOCUMENTS 7,272,322 B2 * 9/2007 Tegge, Jr. .......... H04B 10/1125 398/131
9,725,823 B2 * 8/2017 Sasaki .................... C30B 23/00
(Continued)

FOREIGN PATENT DOCUMENTS

JP 2008-230924 A 10/2008
JP 2014-040858 A 3/2014
(Continued)

*Primary Examiner* — Robert M Kunemund
(74) *Attorney, Agent, or Firm* — Posz Law Group, PLC

(57) ABSTRACT

A silicon carbide single crystal manufacturing apparatus includes a pressure sensor and a computing device. The pressure sensor is configured to measure a gas pressure of a supply gas containing a silicon carbide raw material gas and introduced into a crucible through a gas introducing pipe. The computing device is configured to perform a prediction of a clogging time, which is a time until the gas introduction pipe is clogged with a solid deposit, based on the gas pressure measured by the pressure sensor a learning model created by machine learning using data calculated from results of simulations of growing the silicon carbide single crystal and results of experiments of growing the silicon carbide single crystal.

12 Claims, 7 Drawing Sheets

(51) Int. Cl.
*C30B 29/36* (2006.01)
*C30B 35/00* (2006.01)

(56) References Cited

U.S. PATENT DOCUMENTS

| | | | | |
|---|---|---|---|---|
| 11,543,653 | B2 * | 1/2023 | Fan | G02B 1/002 |
| 11,556,853 | B2 * | 1/2023 | Kataoka | G06N 20/00 |
| 11,592,800 | B2 * | 2/2023 | Yoshida | B23Q 17/0957 |
| 2017/0091672 | A1 | 3/2017 | Sasaki | |
| 2022/0034828 | A1 * | 2/2022 | Ishii | G01N 24/08 |
| 2023/0044970 | A1 * | 2/2023 | Uematsu | C30B 25/16 |

FOREIGN PATENT DOCUMENTS

| | | | |
|---|---|---|---|
| JP | 7234829 | B2 * | 3/2023 |
| WO | 2019/049211 | A1 | 3/2019 |

* cited by examiner

SILICON CARBIDE SINGLE CRYSTAL MANUFACTURING APPARATUS, COMPUTING DEVICE, AND MANUFACTURING METHOD OF SILICON CARBIDE SINGLE CRYSTAL

CROSS REFERENCE TO RELATED APPLICATION

The present application claims the benefit of priority from Japanese Patent Application No. 2023-151432 filed on Sep. 19, 2023. The entire disclosure of the above application is incorporated herein by reference.

TECHNICAL FIELD

The present disclosure relates to a silicon carbide (hereinafter referred to as SiC) single crystal manufacturing apparatus, a computing device for a SiC single crystal manufacturing apparatus, and a manufacturing method of a SiC single crystal.

BACKGROUND

One method for growing a SiC single crystal is a gas growth method in which a SiC source gas is introduced into a SiC single crystal manufacturing apparatus (hereinafter referred to as a crystal manufacturing apparatus) to glow a SiC single crystal on a surface of a seed crystal. In the gas growth method, since the SiC source gas can be continuously supplied for a long period of time, it is expected to glow a long SiC single crystal. However, if a solid deposit accumulates inside the crystal manufacturing apparatus and clogs the gas flow passages, the supply of the SiC source gas is interrupted and the growth conditions change, making it impossible to grow a long SiC single crystal. Thus, it is desirable to predict and respond to clogging of the gas flow passage in the crystal manufacturing apparatus.

SUMMARY

The present disclosure provides a SiC single crystal manufacturing apparatus, a computing device for a SiC single crystal manufacturing apparatus, and a manufacturing method of a SiC single crystal in which a clogging time, which is a time until a gas introduction pipe for introducing a supply gas containing a SiC raw material gas into a crucible is clogged with a solid deposit, based on a gas pressure measured by a pressure sensor and a learning model created by machine learning using data calculated from results of simulations of growing the SiC single crystal and results of experiments of growing the silicon carbide single crystal.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
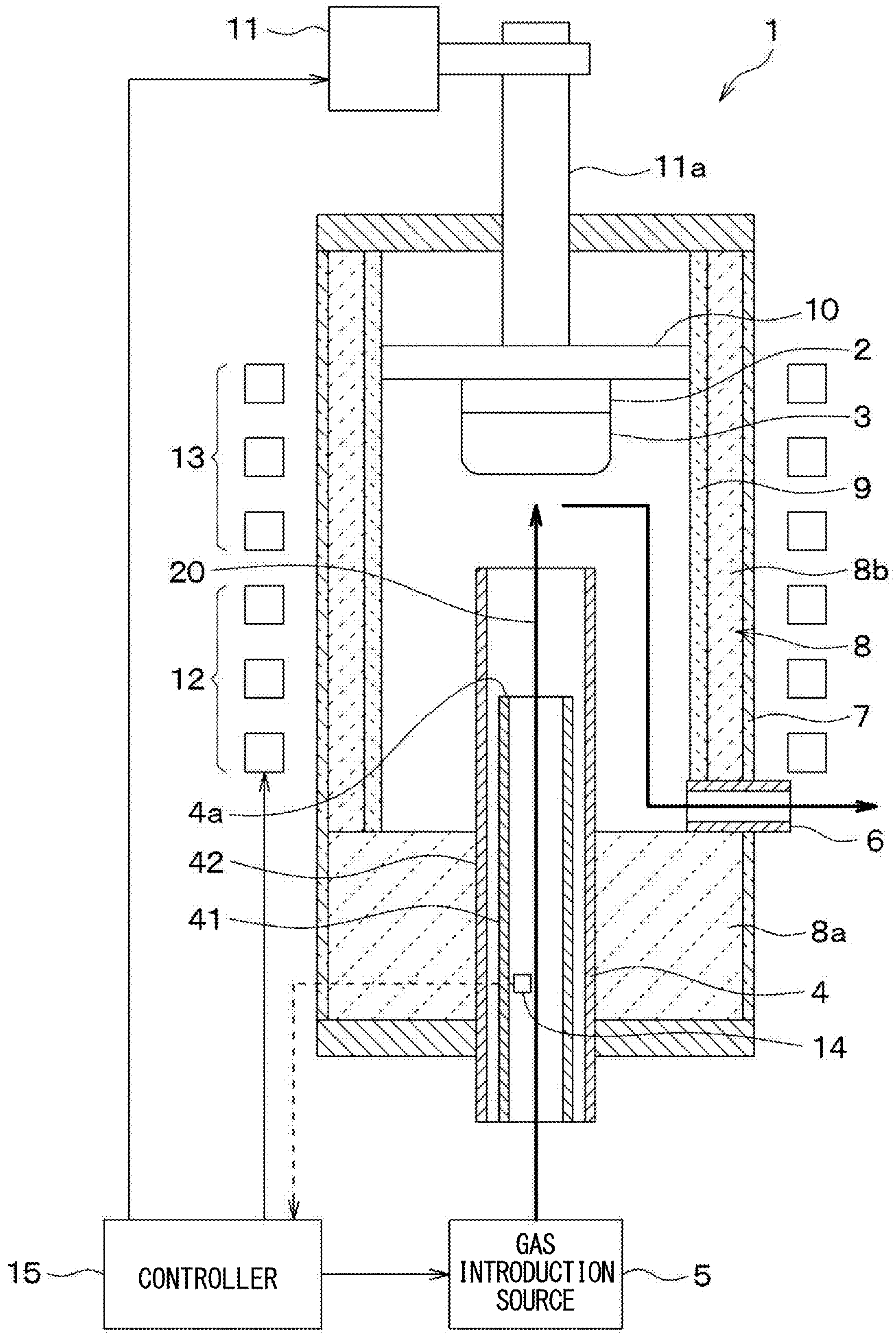
FIG. 1 is a diagram showing a schematic configuration of a crystal manufacturing apparatus according to a first embodiment.

Next, a relevant technology is described only for understanding the following embodiments. In order to predict clogging of a gas flow passage in a crystallization equipment, it is necessary to carry out repeated experiments to monitor a clogging state. For example, in a motor drive device, in order to predict a failure of a fan motor, a rotation speed of the fan motor may be observed and a reward may be calculated from a time when an alarm is output and a time when the fan motor actually fails, and the reward may be stored as past data. Then, the artificial intelligence may predict a failure of the fan motor based on the observation result of the rotation speed of the fan motor and the calculation result of the reward, and may output the alarm if a failure is predicted.

As described above, in a case of the motor drive device, the rotation speed of the fan motor can be directly observed. However, in a case of a crystal manufacturing apparatus, it is difficult to directly observe a volume of a solid deposit that clogs the gas flow passage or powder that is generated in the air and causes the solid deposit.

A silicon carbide single crystal manufacturing apparatus according to a first aspect of the present disclosure includes a crucible, a pedestal, a gas introduction pipe, a heating device, a pressure sensor, and a computing device. The crucible constitutes a reaction chamber and having a cylindrical shape with a hollow portion. The pedestal is disposed in the hollow portion of the crucible and having one surface on which a seed crystal for growing a silicon carbide single crystal is to be disposed. The gas introduction pipe has a gas outlet through which a supply gas containing a silicon carbide raw material gas for growing the silicon carbide single crystal on a surface of the seed crystal is introduced into the crucible from below the pedestal. The heating device is configured to heat and decompose the silicon carbide raw material gas. The pressure sensor is configured to measure a gas pressure of the supply gas. The computing device is configured to perform a prediction of a clogging time, which is a time until the gas introduction pipe is clogged with a solid deposit, based on the gas pressure measured by the pressure sensor and a learning model created by machine learning using data calculated from results of simulations of growing the silicon carbide single crystal and results of experiments of growing the silicon carbide single crystal.

The silicon carbide single crystal manufacturing apparatus described above includes the pressure sensor configured to measure the gas pressure of the supply gas. In addition, based on a fact that there is a correlation between predicted clogging times based on a learning model obtained by combining machine learning through a large number of simulations with experimental results and actual clogging times obtained by experiments, the learning model obtained by machine learning through simulations is created. The clogging time is then predicted based on the gas pressure measured by the pressure sensor and the learning model. Accordingly, it is possible to predict a clogging state based on the measured result of the gas pressure that is a directly observable parameter.

A computing device for a silicon carbide single crystal manufacturing apparatus according to a second aspect of the present disclosure includes a processor and a memory. The memory stores instructions configured to, when executed by the processor and when growing a silicon carbide single crystal using the silicon carbide single crystal manufacturing apparatus in such a manner that a seed crystal is disposed on one surface of a pedestal arranged in a hollow portion of a crucible having a cylindrical shape and constituting a reaction chamber, a supply gas containing a silicon carbide raw material gas is introduced into the crucible from a gas outlet of a gas introduction pipe below the pedestal, and the silicon carbide raw material gas is thermally decomposed and supplied to a surface of the seed crystal to grow the silicon carbide single crystal, cause the processor to acquire a gas pressure of the supply gas measured by a pressure sensor, and perform a prediction of a clogging time, which is a time until the gas introduction pipe is clogged with a solid deposit, based on the gas pressure measured by the pressure sensor and a learning model created by machine learning using data calculated from results of simulations of growing the silicon carbide single crystal and results of experiments of growing the silicon carbide single crystal.

In this manner, the gas pressure of the supply gas is measured by the pressure sensor provided in the crystal manufacturing apparatus. In addition, based on a fact that there is a correlation between predicted clogging times based on a learning model obtained by machine learning through a large number of simulations and actual clogging times obtained by experiments, the learning model obtained by machine learning through simulations is created. The clogging time is then predicted based on the gas pressure measured by the pressure sensor and the learning model. Accordingly, the computing device can predict a clogging state based on the measured result of the gas pressure that is a directly observable parameter.

A manufacturing method of a silicon carbide single crystal according to a third aspect of the present disclosure, includes growing a silicon carbide single crystal using a silicon carbide single crystal manufacturing apparatus by disposing a seed crystal on one surface of a pedestal arranged in a hollow portion of a crucible having a cylindrical shape and constituting a reaction chamber, introducing a supply gas containing a silicon carbide raw material gas into the crucible from a gas outlet of a gas introduction pipe below the pedestal, and thermally decomposing and supplying the silicon carbide raw material gas to a surface of the seed crystal, measuring a gas pressure of the supply gas by a pressure sensor, and perform a prediction of a clogging time, which is a time until the gas introduction pipe is clogged with a solid deposit, based on the gas pressure measured by the pressure sensor and a learning model created by machine learning using data calculated from results of simulations of growing the silicon carbide single crystal and results of experiments of growing the silicon carbide single crystal.

As described above, the gas pressure of the supply gas is measured by the pressure sensor provided in the crystal manufacturing apparatus. In addition, based on a fact that there is a correlation between predicted clogging times based on a learning model obtained by machine learning through a large number of simulations and actual clogging times obtained by experiments, the learning model obtained by machine learning through simulations is created. The clogging time is then predicted based on the gas pressure measured by the pressure sensor and the learning model. Accordingly, it is possible to manufacture the SiC single crystal while predicting a clogging state based on the measured result of the gas pressure that is a directly observable parameter.

Embodiments of the present disclosure will be described below with reference to the drawings.

In the following embodiments including other embodiments to be described below, the same or equivalent components will be described with the same reference numerals.

First Embodiment

A crystal manufacturing apparatus 1 shown in FIG. 1 is used for manufacturing a SiC single crystal ingot by long length growth. The crystal manufacturing apparatus 1 corresponds to a silicon carbide single crystal manufacturing apparatus. The crystal manufacturing apparatus 1 has a function of predicting a clogging time of a gas flow passage, and grows a SiC single crystal 3 on a surface of a seed crystal 2 while predicting the clogging time. In the present disclosure, the term "clogging time" refers to a period from a time at which the crystal manufacturing apparatus 1 predicts clogging of the gas flow passage to a time at which the gas flow passage is clogged. The "clogging time" may be a period from when the gas flow passage of the crystal manufacturing apparatus 1 is not clogged at all to when the gas flow passage is clogged, or may be a period from when the clogging of the gas flow passage is progressing to when the gas flow passage is clogged.

Configuration of Crystal Manufacturing Apparatus 1

The crystal manufacturing apparatus 1 is installed such that the vertical direction of FIG. 1 is oriented in the vertical direction. The crystal manufacturing apparatus 1 supplies a SiC raw material gas to the surface of the seed crystal 2 composed of a SiC single crystal substrate to grow the SiC single crystal 3 on the surface of the seed crystal 2. The crystal manufacturing apparatus 1 includes a gas introduction pipe 4, a gas introduction source 5, a gas exhaust port 6, a vacuum chamber 7, a thermal insulator 8, a heating chamber 9, a pedestal 10, a rotary pulling mechanism 11, first and second heating devices 12 and 13, a pressure sensor 14 and a controller 15.

The gas introduction pipe 4 is provided at a lower position of the crystal manufacturing apparatus 1 and constitutes a piping for introducing a supply gas 20 containing various SiC raw material gases such as silane and propane from the gas introduction source 5 into the crystal manufacturing apparatus 1. The gas introduction pipe 4 extends from below the heating chamber 9 toward the pedestal 10, and a part of the gas introduction pipe 4 is positioned inside the heating chamber 9. The gas introduction pipe 4 introduces the supply gas 20 into the heating chamber 9 from the below the heating chamber 9. In the example shown in FIG. 1, the gas introduction pipe 4 is configured to protrude from a bottom surface of the vacuum chamber 7 toward the pedestal 10. However, the gas introduction pipe 4 may also be configured not to protrude from the bottom surface of the vacuum chamber 7. The gas introduction pipe 4 introduces the supply gas 20 from the gas introduction source 5 into the crystal manufacturing apparatus 1, either in a state of individual gases or as a mixed gas. The supply gas 20 may contain gases other than the source gases, for example, a carrier gas such as $H_2$ (hydrogen), an etching gas such as chlorosilane, and a dopant gas such as $N_2$ (nitrogen). Thus, the gas introduction pipe 4 may have a piping structure in which the gas species are separately introduced into the crystal manufacturing apparatus 1, or the gas introduction pipe 4 may have a piping structure in which some or all of the gas species are mixed into a mixed gas and then the mixed gas is introduced into the crystal manufacturing apparatus 1.

In the present embodiment, the gas introduction pipe 4 includes a first introduction pipe 41 arranged concentrically and a second introduction pipe 42 arranged at a distance from the first introduction pipe 41 on its outer periphery, and the supply gas 20 is introduced through the first introduction pipe 41. The second introduction pipe 42 may be omitted. In the present embodiment, the supply gas 20 is not introduced through the second introduction pipe 42. The supply gas 20 containing the same SiC raw material gas may be introduced from the first introduction pipe 41 and the second introduction pipe 42, or types of gases introduced through the first introduction pipe 41 and the second introduction pipe 32 may be different from each other. For example, the SiC raw material gas may be introduced from the first introduction pipe 41 and the etching gas may be introduced from the second introduction pipe 42.

An outlet of the gas introduction pipe 4 at a portion through which the SiC raw material gas is introduced is referred to as a gas outlet 4*a*. In the present embodiment, even when a downstream end of the second introduction pipe 42 in a flow direction of the supply gas 20 protrudes closer to the pedestal 10 than a downstream end of the first introduction pipe 41, an outlet of the first introduction pipe 41 that introduces the SiC raw material gas is defined as the gas outlet 4*a*.

The gas introduction source 5 supplies the supply gas 20 containing the SiC raw material gas into the crystal manufacturing apparatus 1. In the present embodiment, the gas introduction source 5 includes the SiC raw material gas source such as silane or propane. In a case where a carrier gas, an etching gas, or a dopant gas is used, the gas introduction source 5 further includes a source of gas to be used.

Although not shown, the gas introduction source 5 is equipped with a heating device for controlling a temperature of the supply gas 20 and a flow rate control device for controlling a flow rate, and the temperature and the flow rate of each gas can be controlled according to a growth state of the SiC single crystal 3. When other gas species are used as the supply gas 20 in addition to the SiC raw material gas, a heating device and a flow rate control device are provided for each gas species.

The gas exhaust port 6 exhausts a waste portion of the supply gas 20 after the supply gas 20 is supplied to the seed crystal 2, that is, an unreacted gas of the SiC raw material gas, the carrier gas, the dopant gas, and the like to the outside of the crystal manufacturing apparatus 1 as exhaust gas.

The vacuum chamber 7 is made of quartz glass or the like and has a bottomed tube shape providing a hollow portion. In the present embodiment, the vacuum chamber 7 has a bottomed cylindrical shape. The vacuum chamber 7 is configured so that the supply gas 20 can be introduced and exhausted. The vacuum chamber 7 accommodates other components of the crystal manufacturing apparatus 1. The vacuum chamber 7 has a structure capable of reducing a pressure in an accommodated internal space by vacuum drawing. As described above, the gas introduction pipe 4 and the gas introduction source 5 for supplying the supply gas 20 are provided at the bottom of the vacuum chamber 7. The vacuum chamber 7 has a side wall that is penetrated at a middle position in a height direction, and the gas exhaust port 6 is disposed at a penetrated portion of the side wall.

The thermal insulator 8 has a tube shape providing a hollow portion, in the present embodiment, a cylindrical shape, and is disposed coaxially with the vacuum chamber 7. Specifically, the thermal insulator 8 is includes a bottom portion 8*a* and a side wall portion 8*b*. The bottom portion 8*a* has a cylindrical shape providing a hollow portion into which the gas introduction pipe 4 is fitted. The side wall portion 8*b* has a cylindrical shape and extends toward the pedestal 10 along an outer peripheral surface of the bottom portion 8*a*. The bottom portion 8*a* and the side wall portion 8*b* have a smaller diameter than the vacuum chamber 7 and are positioned inside the vacuum chamber 7. Accordingly, thermal insulator 8 restricts heat transfer from a growth space inside the thermal insulator 8 toward the vacuum chamber 7. The thermal insulator 8 is made of, for example, graphite. A surface of the thermal insulator 8 may be coated with a high-melting point metal carbide such as tantalum carbide (TaC) or niobium carbide (NbC) so as to be less likely to be thermally etched. The thermal insulator 8 is penetrated at a middle position in a height direction, and the gas exhaust port 6 is disposed at a penetrated portion.

The heating chamber 9 configures a crucible serving as a reaction chamber, and has a tube shape providing a hollow portion, in the present embodiment, a cylindrical shape. The hollow portion of the heating chamber 9 forms the growth space for the SiC single crystal 3 on the surface of the seed crystal 2. The heating chamber 9 is made of, for example, graphite. A surface of the heating chamber 9 may be coated with a high-melting point metal carbide such as TaC or NbC so as to be less likely to be thermally etched.

The heating chamber 9 is disposed so as to surround the pedestal 10, and is penetrated at a lower position, in which the gas exhaust port 6 is disposed. Although there is a small gap between an inner peripheral surface of the heating chamber 9 and the pedestal 10, the gap is narrow. Thus, the exhaust gas is bent back downward by the pedestal 10. Therefore, as shown by the arrows in FIG. 1, the supply gas 20 introduced from the gas introduction pipe 4 is supplied to the seed crystal 2 and a growth surface of the SiC single crystal 3, then turned back by the pedestal 10, passes between the heating chamber 9 and the gas introduction pipe 4, and is then exhausted to the outside from the gas exhaust port 6. The SiC raw material gas contained in the supply gas 20 is decomposed by the heating chamber 9 heated by the first and second heating devices 12 and 13 before the supply gas 20 from the gas introduction pipe 4 is introduced to the seed crystal 2.

The pedestal 10 is a member for placing the seed crystal 2. The pedestal 10 has, for example, a disk shape. The seed crystal 2 having a circular plate shape is placed on one surface of the pedestal 10 facing the growth space, and the SiC single crystal 3 is grown on the surface of the seed crystal 2. For example, a central axis of the pedestal 10 is arranged coaxially with a central axis of the heating chamber 9 and a central axis of a shaft 11*a* of the rotary pulling mechanism 11. The pedestal 10 is made of, for example, graphite. A surface of the pedestal 10 may be coated with a high-melting point metal carbide such as TaC or NbC to be less likely to be thermally etched. The pedestal 10 is connected to the shaft 11*a* in a surface opposite to the surface on which the seed crystal 2 is disposed. The pedestal 10 is rotated with the rotation of the shaft 11*a*, and can be pulled upward while the shaft 11*a* is pulled up.

The rotary pulling mechanism 11 rotates and pulls up the pedestal 10 through the shaft 11*a* formed of a pipe member or the like. In the present embodiment, the shaft 11*a* is formed in a straight line extending up and down. One end of the shaft 11*a* is connected to the surface of the pedestal 10 opposite to the surface on which the seed crystal 2 is attached, and the other end of the shaft 11*a* is connected to a main body of the rotary pulling mechanism 11. The shaft 11*a* is also made of, for example, graphite. A surface of the shaft 11*a* may be coated with a high-melting point metal carbide such as TaC or NbC to be less likely to be thermally etched. With the above configuration, the pedestal 10, the seed crystal 2, and the SiC single crystal 3 can be rotated and pulled up, so that the growth surface of the SiC single crystal 3 can have a desired temperature distribution, and a temperature of the growth surface can be adjusted to a temperature suitable for growth along with the growth of the SiC single crystal 3.

The first and second heating devices 12 and 13 are formed of a heating coil such as an induction heating coil or a direct heating coil, and are disposed so as to surround a periphery of the vacuum chamber 7. In the case of the present embodiment, the first and second heating devices 12 and 13 are configured by induction heating coils. The first heating device 12 and the second heating device 13 are configured to be capable of independently controlling the temperature of a target location. The first heating device 12 is disposed at a position corresponding to a lower position of the heating chamber 9, and the second heating device 13 is disposed at a position corresponding to the pedestal 10. Therefore, the temperature of the lower portion of the heating chamber 9 can be controlled by the first heating device 12 to heat and decompose the SiC raw material gas. In addition, the temperature around the pedestal 10, the seed crystal 2, and the SiC single crystal 3 can be controlled to a temperature suitable for the growth of the SiC single crystal 3 by the second heating device 13.

The pressure sensor 14 measures a pressure of the supply gas 20 containing the SiC source gas. It is preferable that the pressure sensor 14 is positioned inside the gas introduction pipe 4 compared to the gas outlet 4*a*, that is, at a position not extending beyond the gas outlet 4*a*, to measure the pressure of the supply gas 20 containing the SiC raw material gas within the gas introduction pipe 4. It is more preferable that the pressure sensor 14 is disposed below a surface of the bottom portion 8*a* of the thermal insulator 8 that faces the pedestal 10.

The pressure sensor 14 may be disposed at any position where the pressure sensor 14 can measure the pressure of the supply gas 20 containing the SiC raw material gas, However, a position that is most likely to be clogged in the gas flow passage is the supply passage of the SiC raw material gas, which is the first introduction pipe 41 in the present embodiment. Thus, the pressure sensor 14 is disposed at a position inside the first introduction pipe 41 located upstream of the gas outlet 4*a* in the flow direction of the supply gas 20 (hereinafter simply referred to as upstream). More specifically, the pressure sensor 14 is disposed at a position in the first introduction pipe 41 located below that surface of the bottom portion 8*a* that faces the pedestal 10, where heat transfer is hindered by the thermal insulator 8.

In the present embodiment, the gas introduction pipe 4 has a piping structure in which the first introduction pipe 41 is surrounded by the second introduction pipe 42 at a position located downstream of the gas outlet 4*a* in the flow direction of the supply gas 20 (hereinafter simply referred to as downstream). Therefore, various gases from the first introduction pipe 41 and the second introduction pipe 42 can join at this position. In the above-described piping structure, the pressure sensor 14 may be disposed at a position in the second introduction pipe 42 located downstream of the gas outlet 4*a*. However, when the pressure sensor 14 is disposed upstream of the gas outlet 4*a* where clogging is predicted, it is easier to measure the gas pressure that changes depending on the clogging state. Thus, it is preferable to dispose the pressure sensor 14 in the first introduction pipe 41, which is more likely to be clogged than the second introduction pipe 42.

In the present embodiment, various gases introduced from the first introduction pipe 41 and the second introduction pipe 42 join together. However, the gas introduction pipe 4 may also have a piping structure in which multiple introduction pipes remain separate and various gases do not join together. In that case, it is preferable that the pressure sensor 14 is disposed in an introduction pipe through which the SiC source gas is introduced.

The controller 15 corresponds to a computing device. The controller 15 controls the flow rate and the temperature of the gases supplied from the gas introduction source 5, controls the temperature at the lower position of the heating chamber 9 and the temperature at the growth surface position of the SiC single crystal 3 by the first and second heating devices 12, 13, and controls the pulling amount by the rotary pulling mechanism 11. The controller 15 also stores a learning model based on experiments and simulations, and predicts the clogging time based on the learning model. The learning model stored in the controller 15 and the prediction of the clogging time will be described later.

The crystal manufacturing apparatus 1 is configured as described above. Next, a manufacturing method of the SiC single crystal 3 using the crystal manufacturing apparatus 1 configured as above will be described.

[Manufacturing Method of SiC Single Crystal 3]

First, the seed crystal 2 is attached to the one surface of the pedestal 10. The seed crystal 2 is, for example, an off substrate in which the growth surface of the SiC single crystal 3, that is, one surface opposite to the pedestal 10 has a predetermined off-angle, such as 4° or 8°, with respect to a (0001) C-plane. Subsequently, the pedestal 10 and the seed crystal 2 are disposed in the heating chamber 9. Then, the first heating device 12 and the second heating device 13 are controlled to provide a desired temperature distribution. In other words, the temperature distribution is controlled such that the SiC raw material gas contained in the supply gas 20 is heated and decomposed to be supplied to the surface of the seed crystal 2, and the SiC raw material gas is recrystallized on the surface of the seed crystal 2, while a sublimation rate is higher than a recrystallization rate in the heating chamber 9. Accordingly, the temperature of the bottom portion of the heating chamber 9 can be set to a high temperature of 2000° C. or higher, for example, 2500° C., and the temperature of the surface of the seed crystal 2 can be set to a temperature lower than that of the bottom portion of the heating chamber 9 and suitable for recrystallization of the SiC single crystal 3, for example, about 2200° C.

In addition, while the vacuum chamber 7 is maintained at a desired pressure, the supply gas 20 containing the SiC raw material gas is introduced through the gas introduction pipe 4. As a result, the supply gas 20 is supplied to the seed crystal 2 as shown by the arrow in FIG. 1 and the SiC single crystal 3 is grown on the surface of the seed crystal 2. Then, the rotary pulling mechanism 11 pulls up the pedestal 10 and the seed crystals 2 and the SiC single crystal 3 in accordance with the growth rate of the SiC single crystal 3 while rotating them through the shaft 11*a*. As a result, a height of the growth surface of the SiC single crystal 3 is kept substantially constant, and the temperature distribution of the growth surface temperature can be controlled with high controllability.

When growing the SiC single crystal 3 in this manner, the clogging time of the gas introduction pipe 4 is predicted based on the learning model stored in the controller 15. The following describes the learning model stored in the controller 15 and the clogging time prediction.

[Learning Model and Clogging Time Prediction]

When creating a learning model, it is conceivable that a large number of experiments are carried out to accumulate data and the learning model is created based on the accumulated data. However, a reinforcement learning, in which modeling is performed after accumulating data through multiple experiments, is not suitable for growing the SiC single crystal 3 because of the following reasons. A growth process of the SiC single crystal 3 includes increasing the temperature from room temperature to a high temperature exceeding 2000° C., growing the SiC single crystal 3, and then decreasing the temperature of the crystal manufacturing apparatus 1 that has been further heated. The temperature increase process, the growth process, and the temperature decrease process all take a long time, and each manufacturing process of the SiC single crystal 3 requires high costs in terms of time and money. Thus, it is difficult to conduct multiple experiments, and reinforcement learning that involves multiple experiments is not suitable for predicting clogging in the crystal manufacturing apparatus 1. In addition, graphite parts such the thermal insulator 8 and heating chamber 9 are used within the crystal manufacturing apparatus 1, but the deterioration state of these parts is not constant. Thus, in terms of reproducibility, reinforcement learning based on multiple experiments is not suitable for predicting the clogging time of the crystal manufacturing equipment 1.

Therefore, as a method for creating the learning model without conducting multiple experiments, the present inventor carried out a verification whether it is possible to model the results of a large number of simulations and perform fitting based on the results of a small number of experiments. When conducting a large number of experiments and modeling the results, the SiC single crystal 3 is actually grown in the crystal manufacturing apparatus 1, and the time until the gas introduction pipe 4 becomes clogged with a solid deposit is directly observed. Therefore, when the results of the large number of experiments are modeled, there is a correlation between the actual clogging time until the gas introduction pipe 4 becomes clogged when the SiC single crystal 3 is actually grown using the crystal manufacturing apparatus 1 and the clogging time predicted based on the learning model.

However, when the results of the large number of simulations are modeled, if there is no correlation with the experimental results, the modeling based on the simulation results is meaningless. Therefore, the present inventor carried out the verification. As a result, the present inventor found a correlation between the experimental results and the simulation results, and confirmed that it is possible to model the results of a large number of simulations and perform fitting based on the results of a small number of experiments.

Specifically, a furnace structure of the crystal manufacturing apparatus 1 shown in FIG. 1, types of gases introduced during the growth of the SiC single crystal 3, the gas flow rate, the temperature, and other conditions (hereinafter referred to as growth conditions) were determined, and the clogging time from the start of growth until the vicinity of the gas outlet 4*a* of the gas introduction pipe 4 was clogged with a solid deposit was measured. The furnace structure refers to the structure of the crystal manufacturing apparatus 1 including the dimensions, thicknesses, and the like of the vacuum chamber 7, the thermal insulator 8, the heating chamber 9, and the like. In addition, a simulation model having the same structure as the crystal manufacturing apparatus 1 used in the experiment was adopted to obtain simulation values for the temperature, the gas flow rate, and the solid generation amount at each coordinate point. When the solid generation amount reaches the radius of the gas outlet 4*a* of the gas introduction pipe 4, it is assumed that the gas outlet 4*a* is clogged with a solid deposit generated on the inner wall surface on both sides of the central axis of the gas introduction pipe 4. Therefore, the time from the start of growth until the solid deposit reaches the radius of the gas outlet 4*a* was defined as the clogging time.

Figure 2:
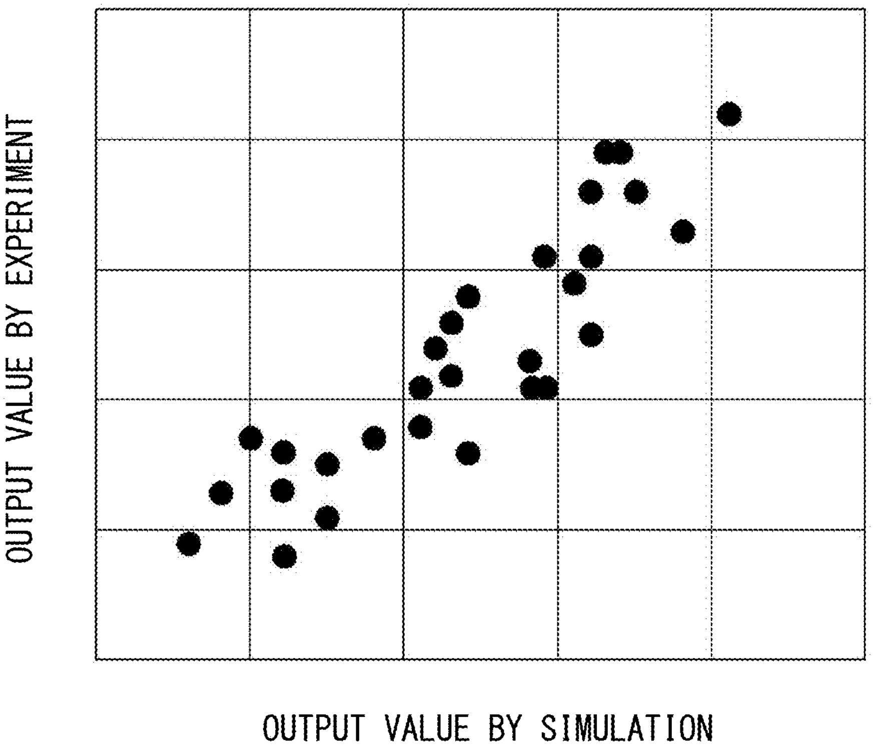
FIG. 2 is a correlation diagram plotting output values of clogging times obtained by simulations and output values of clogging times obtained by experiments.

As a result, the results shown in FIG. 2 were obtained. At each point in FIG. 2, a value on the vertical axis indicates an output value of the clogging time obtained as a result of an experiment and a value on the horizontal axis indicates an output value of the clogging time predicted as a result of a simulation under the same growth condition as the experiment. The growth conditions for each plot were different from each other. As can be seen by analyzing FIG. 2, when comparing plots of different conditions, there is a tendency that the clogging time in the simulation increases with increase in the clogging time in the experiment. Thus, it can be said that the clogging time in the experiment and the clogging time in the simulation have a relationship with a certain degree of regularity, and the clogging time in the experiment and the clogging time in the simulation are correlated.

Therefore, by performing machine learning using the data obtained by performing a large number of simulations as training data and then fitting the learning model obtained by the machine learning to experimental values, it is possible to predict the clogging time with high accuracy even if only a small number of experiments are performed.

The present inventor further examined various parameters as parameters to be used for predicting the clogging time, and confirmed that there is a particular correlation with the clogging time when a gas pressure measured at a position upstream in the flow direction of the supply gas 20 of the location where a solid deposit has adhered is used as a parameter.

Figure 3:
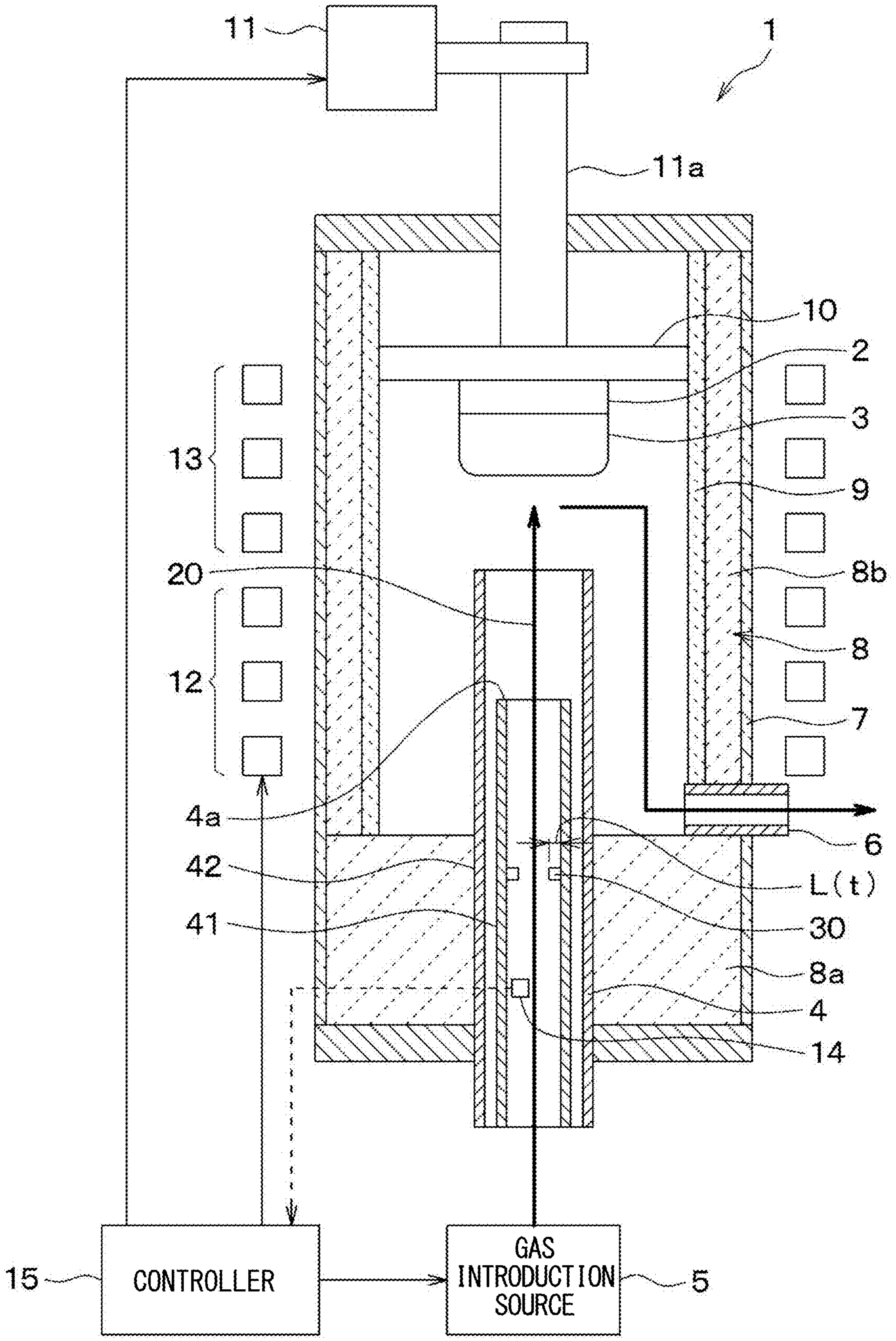
FIG. 3 is a diagram showing a schematic configuration of a crystal manufacturing apparatus adopted to create a simulation model.

Specifically, as shown in FIG. 3, a simulation model was created in which a pseudo-annular solid deposit 30 was attached to the inner peripheral wall of the gas introduction pipe 4, and the relationship between the size of the solid deposit 30 and the gas pressure Pobs at a position upstream of the solid deposit 30 was examined by analyzing simulation data. A dimension of the solid deposit 30 in a radial direction of the gas introduction pipe 4 is defined as L(t), and the dimension L(t) is changed to obtain the corresponding gas pressure Pobs. A dimension of the solid deposit 30 in the central axial direction of the gas introduction pipe 4 was set to 23.5 mm, and an inner dimension of the gas introduction pipe 4 was set to a radius of 15 mm. The inner dimension of the gas introduction pipe 4 is any value determined according to the dimensions of each part of the crystal manufacturing apparatus 1. The dimension of the solid deposit 30 was empirically determined based on experiments.

Figure 4:
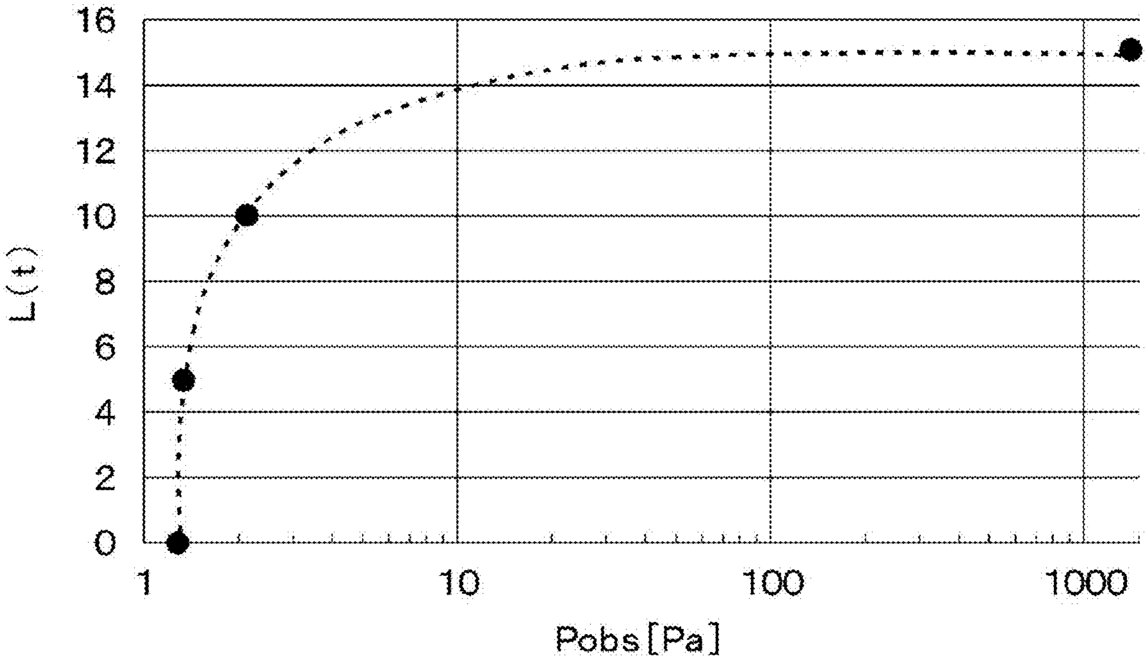
FIG. 4 is a graph showing a relationship between a gas pressure and a dimension of a solid deposit obtained by simulations.

As a result of the simulation, when the dimension L(t)=0 mm, 5 mm, 10 mm, and 15 mm, the gas pressure Pobs was 1.28145 [Pa], 1.34166 [Pa], 2.14737 [Pa], and 1423.02 [Pa], respectively. The results of this simulation are plotted as shown in FIG. 4, and it can be seen that there is a relationship in which the gas pressure Pobs increases with increase in the dimension L(t). In other words, it is recognized that there is a correlation between the dimension L(t) and the gas pressure Pobs.

Figure 5:
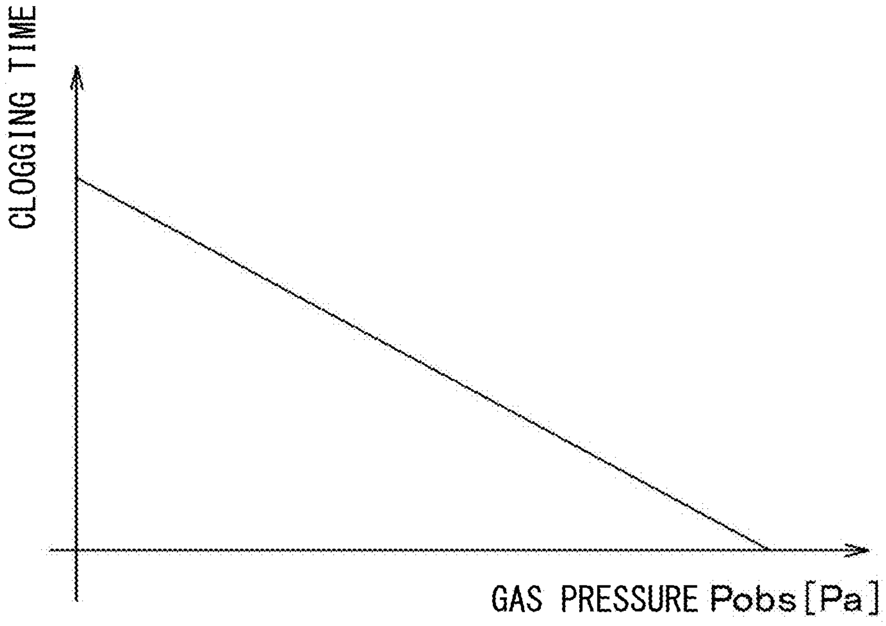
FIG. 5 is a diagram showing an assumed correlation between the gas pressure Pobs and the clogging time.

On the other hand, if the dimension L(t) could be directly observed, the clogging time of the gas introduction pipe 4 could be confirmed, but it is difficult to directly observe the inside of the crystal manufacturing apparatus 1 during the growth of the SiC single crystal 3. However, if the gas pressure Pobs can be measured, it is possible to estimate the dimension L(t) of the solid deposit, which is correlated with the gas pressure Pobs, and the clogging time can be predicted from the estimated dimension L(t). Specifically, since it is assumed that the gas introduction pipe 4 is more clogged with the solid deposit 30 with increase in the gas pressure Pobs, the clogging time shortens with increase in the gas pressure Pobs. Thus, there is a correlation in which the clogging time shortens linearly or nonlinearly with increase in the gas pressure Pobs. For example, as shown in FIG. 5, a correlation in which the clogging time shortens linearly with increase in the gas pressure Pobs is assumed.

Therefore, if the simulation results satisfy this correlation, it can be said that the clogging time prediction using the simulation model is valid. In addition, since the simulation result shows that the gas pressure Pobs increases with increase in the dimension L(t) as shown in FIG. 4, it can be said that the validity of the clogging time prediction using the simulation model is proven. Therefore, when the pressure sensor 14 for measuring the gas pressure Pobs is disposed at a location where the gas pressure Pobs varies depending on the clogging state, and the gas pressure Pobs is measured by the pressure sensor 14, the size of the solid deposit 30 can be estimated based on the gas pressure Pobs, and the clogging time can be predicted. For example, it is preferable to dispose the pressure sensor 14 upstream of a position in the gas introduction pipe 4 that is assumed to be particularly susceptible to clogging by a solid deposit 30.

Based on the above verification, it was confirmed that it is possible to create a learning model for predicting the clogging time by modeling the results of a large number of simulations and fitting them based on the results of a small number of experiments. Therefore, the inventor performed a large number of simulations and applied machine learning to data showing the results of the simulations to create a learning model.

Any method such as neural network or deep learning can be used for machine learning. When using a neural network, a learning model can be created, for example, as follows.

Figure 6:
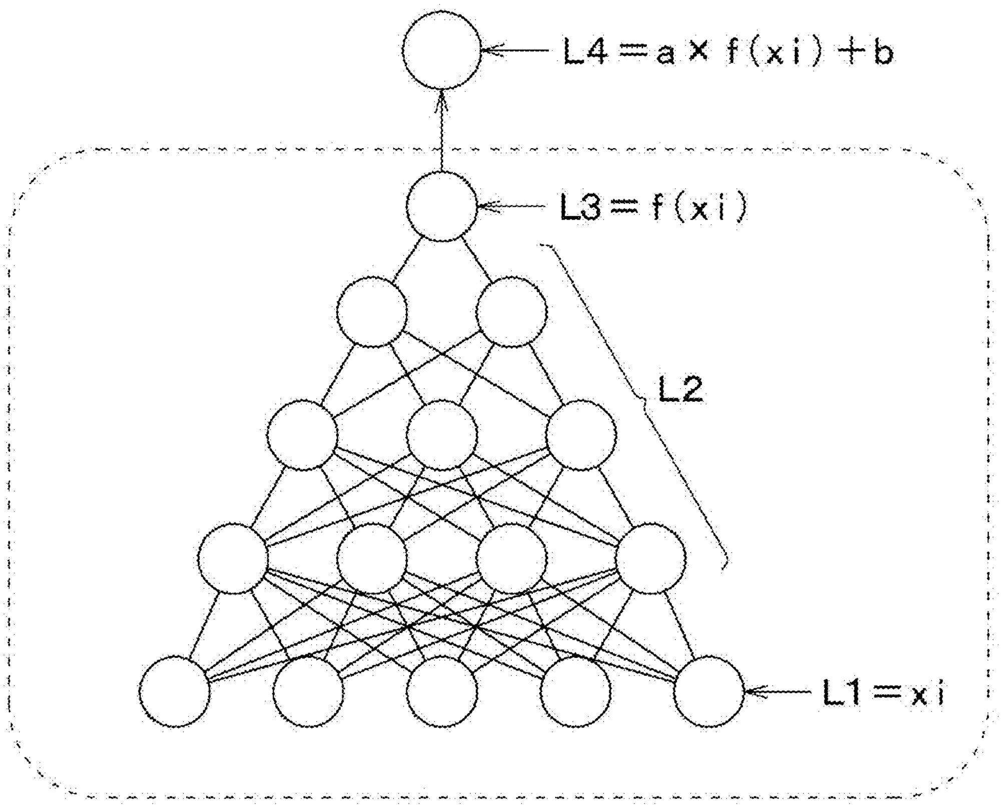
FIG. 6 is a diagram showing a learning model of machine learning using a neural network.

Specifically, a large number of simulations, for example 1,000 to 10,000 simulations, are performed, and data relating to various conditions for growing the SiC single crystal 3 used in the simulations are input as the input values xi. For example, data on the configuration of the crystal manufacturing apparatus 1, data on the types of gases used, data on gas flow rates, data on the temperature of each part in the crystal manufacturing apparatus 1, and the like are input as data for the input values xi in an input layer. Then, using the input simulation data as teacher data, learning is carried out by a neural network to create a learning model as shown in FIG. 6. For example, a learning model is created in which an output value f(xi) in an output layer L3 is obtained for an input value xi of each node in an input layer L1 via an intermediate layer L2. The input value xi varies depending on the various conditions under which the simulation is performed, and various conditions corresponding to each of the simulations are input.

In this case, the learning model may be a model having the input layer L1, the intermediate layer L2, and the output layer L3, which are surrounded by a dashed line in FIG. 6. However, it is preferable to also incorporate a correction layer L4 that takes into account an offset between the value of the output layer L3 of the neural network and the output values of the simulations. The value of the correction layer L4 can be a function expressed as y=a×f(xi)+b based on the output value f(xi), for example.

Figure 7:
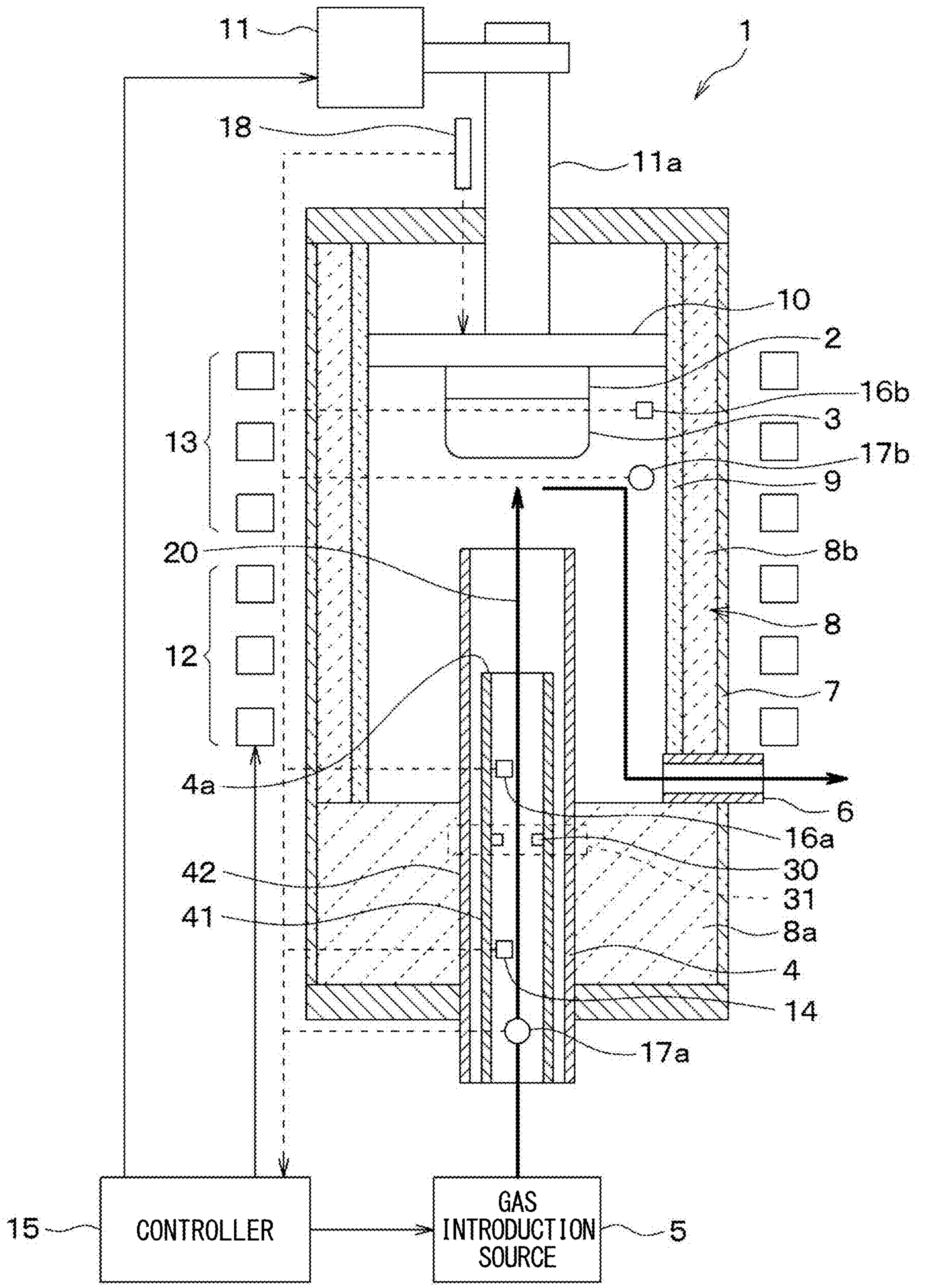
FIG. 7 is a diagram showing a schematic configuration of a crystal manufacturing apparatus adopted to create a learning model.

Then, data on various conditions obtained by performing experiments fewer times than the number of simulations, for example 30 times, is input, and fitting is performed using data on the actual clogging time. In this example, an experiment is conducted in which various sensors are disposed to measure the state of each part of the crystal manufacturing apparatus 1 as shown in FIG. 7, and the temperature inside the crystal manufacturing apparatus 1 is raised from 20° C. to 2500° C. to grow the SiC single crystal 3. The various sensors include the pressure sensor 14 located upstream of gas outlet 4*a* in gas introduction pipe 4, pressure sensors 16*a* and 16*b*, flow rate sensors 17*a* and 17*b*, a pyrometer 18, and the like. The pressure sensor 16*a* is disposed at a position downstream of a clogging surface 31 (surrounded by a dashed line) that is assumed to be clogged by the solid deposit 30 in the first introduction pipe 41. The pressure sensor 16*b* is disposed in the growth space. The flow rate sensor 17*a* is disposed at a position where the flow rate of the supply gas 20 at the location where the pressure sensor 14 is disposed is measured. The flow rate sensor 17*b* is disposed at a position to measure the gas flow rate in the growth space. The pyrometer 18 is disposed at a position to measure the temperature of a rear surface of the pedestal 10. Then, various conditions obtained from the experimental conditions are input as the input values x to the learning model shown in FIG. 6, and the actual clogging time data obtained during the experiment is input to the correction layer L4 so as to fine-tune a and b in the function y=a×f(x)+b of the correction layer L4. Accordingly, it is possible to fit the learning model obtained by the simulations to the experimental results, and improve the learning model so as to predict the clogging time with higher accuracy.

Once the learning model in which the experimental results are fitted to the simulation data has been obtained in this manner, data on various conditions are then input as input values xi of each node in the input layer L1 when actually manufacturing the SiC single crystal 3. For example, data on the configuration of the crystal manufacturing apparatus 1, data on the types of gases used, data on gas flow rates, data on the temperature of each part in the crystal manufacturing apparatus 1, and the like are input as the input values xi. Accordingly, it is possible to obtain the clogging time predicted under those conditions as the values of the output layer L3 and the correction layer L4 of the learning model.

Figure 8:
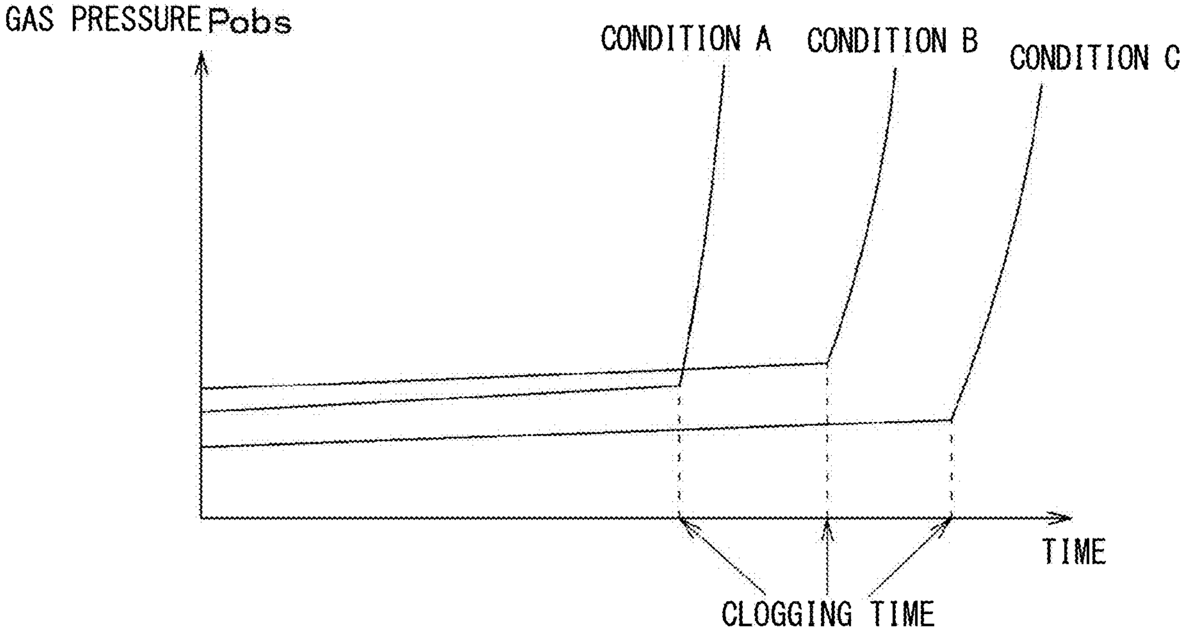
FIG. 8 is a diagram showing a relationship between the gas pressure Pobs and the clogging time under various different growth conditions.

When various different conditions are input, the clogging time is predicted according to those conditions, and the relationship between the gas pressure Pobs and the clogging time can be obtained based on the predicted clogging time, for example, as shown in FIG. 8. FIG. 8 shows cases in which different clogging times are obtained when various different conditions are input as conditions A, B, and C, and the relationship between the gas pressure Pobs and the clogging time according to each condition is obtained. Then, once the relationship between the gas pressure Pobs and the clogging time has been determined in this manner, the clogging time from a time point to clogging can be predicted based on that relationship and the gas pressure Pobs indicated by the measurement value of the pressure sensor 14.

As described above, the crystal manufacturing apparatus 1 includes the pressure sensor 14 configured to measure the gas pressure Pobs of the supply gas 20. In addition, based on a fact that there is the correlation between the predicted clogging time based on the learning model obtained by the machine learning through the large number of simulations and the actual clogging time obtained by the experiments, the learning model is created by combining the machine learning through the simulations with the experimental results. Then, the clogging time is predicted based on the gas pressure Pobs measured by the pressure sensor 14 and the learning model. Accordingly, it is possible to predict the clogging state based on the measured result of the gas pressure Pobs that is a directly observable parameter.

Furthermore, the crystal manufacturing apparatus 1 of the present embodiment can provide the following effects.

In the present embodiment, the pressure sensor 14 is disposed upstream of the gas outlet 4*a* of the gas introduction pipe 4 in the crystal manufacturing apparatus 1, so that the gas pressure Pobs depending on the clogged state can be measured. Accordingly, it is possible to predict the clogging state with high accuracy.

Since the learning model can be created through the simulations, it is possible to create the learning model without conducting a large number of experiments. Therefore, it is possible to reduce the experiment cost.

When the learning model is fine-tuned by being combined with the results of a small number of experiments, it is possible to predict the clogging time with higher accuracy.

Since the clogging time changes depending on various conditions, the controller 15 can also use the learning model to calculate and output an optimal process that optimizes the growth conditions, the configuration of the crystal manufacturing apparatus 1, and the like within a feasible range, using the clogging time as an objective variable. For example, the controller 15 can calculate the clogging time using the learning model and derive the growth conditions and the configuration of the crystal manufacturing apparatus 1 that will lengthen the clogging time, so as to lengthen the clogging time.

The controller 15 can also feedback the predicted clogging time, calculate the growth conditions for the SiC single crystal 3 that can lengthen the clogging time, and output those growth conditions, for example, by making adjustments to achieve those growth conditions. For example, the gas pressure Pobs is measured during the growth of the SiC single crystal 3 to predict the clogging time, and various conditions including the predicted clogging time and the gas pressure Pobs are fed back. In addition, the controller 15 determine the growth conditions, such as at least one of various conditions including the types of gases, the gas flow rates, and the temperature of the reaction chamber, that will lengthen the clogging time using the learning model. By adjusting the growth conditions to achieve the desired growth conditions, the clogging time can be further lengthened.

If the change over time in the gas pressure Pobs does not coincide with the predicted change shown in FIG. 8, deterioration of the heating chamber 9 or the thermal insulator 8 may have occurred. These are not constant, unpredictable changes and are difficult to predict through simulation. Even in such a case, by feeding back various conditions including the gas pressure Pobs to find conditions that are less likely to cause clogging, it is possible to obtain various conditions that take into account changes in conditions that cannot be predicted by simulation, and further lengthen the clogging time.

Other Embodiments

While the present disclosure has been described in accordance with the embodiment described above, the present disclosure is not limited to the embodiment and includes various modifications and equivalent modifications. In addition, various combinations and configurations, as well as other combinations and configurations that include only one element, more, or less, fall within the scope and spirit of the present disclosure.

For example, in the above embodiment, as shown in FIG. 6, an example has be shown in which the number of nodes in the input layer L1 of the learning model is five, and the number of layers in the intermediate layer L2 is three. However, the numbers of nodes in the input layer L1 and the intermediate layer L2, and the number of layers in the intermediate layer L2 can be set optionally.

The learning model can be made more accurate by providing the correction layer L4 that takes into account the offset or by performing fitting based on experimental results. However, the learning model may also be created based on a large number of simulations. The number of simulations and experiments to be performed when creating the learning model is also any number. However, the learning model can be more accurate when the number of simulations or the number of experiments is increased.

In addition, in the above embodiment, an example has been described in which the neural network is used as machine learning. However, other learning methods such as deep learning, support vector machines, random forests, and k-nearest neighbor methods may also be applied.

In the above embodiment, the crystal manufacturing apparatus 1 is described as being equipped with the controller 15 that stores the learning model. However, the present disclosure can also be such that the controller 15 is a computing device that performs clogging time prediction and is configured separately from the crystal manufacturing apparatus 1. In this case, the computing device stores the learning model, acquires data indicating the measurement results from the pressure sensor 14, and predicts the clogging time based on the measurement results and the learning model. Similarly, the present disclosure can be understood as a method for predicting the clogging time.

In addition, in the above embodiment, the crystal manufacturing apparatus 1 employs a side-flow system in which the supply gas 20 is supplied to the growth surface of the SiC single crystal 3 and then discharged in the outer peripheral direction of the heating chamber 9. This is just one example. For example, the crystal manufacturing apparatus 1 may employ an up-flow system, in which the supply gas 20 passes over the outer peripheral surface of the SiC single crystal 3 and beside the pedestal 10 and is discharged further upward. In another example, the crystal manufacturing apparatus 1 may employ a return flow system in which the supply gas 20 is supplied to the growth surface of the SiC single crystal 3 and then returned in the same direction as the supply direction.

The controller 15, that is, the computing device and the method thereof described in the present disclosure may be realized by a dedicated computer provided by configuring a processor and a memory programmed to execute one or more functions embodied by a computer program. Alternatively, the controller and the method described in the present disclosure may be implemented by a special purpose computer configured as a processor with one or more special purpose hardware logic circuits. Alternatively, the controller and the method described in the present disclosure may be implemented by one or more special purpose computer, which is configured as a combination of a processor and a memory, which are programmed to perform one or more functions, and a processor which is configured with one or more hardware logic circuits. The computer program may be stored, as instructions to be executed by a computer, in a tangible non-transitory computer-readable medium.

What is claimed is:

1. A silicon carbide single crystal manufacturing apparatus comprising:

a crucible constituting a reaction chamber and having a cylindrical shape with a hollow portion;

a pedestal disposed in the hollow portion of the crucible and having one surface on which a seed crystal for growing a silicon carbide single crystal is to be disposed;

a gas introduction pipe having a gas outlet through which a supply gas containing a silicon carbide raw material gas for growing the silicon carbide single crystal on a surface of the seed crystal is introduced into the crucible from below the pedestal;

a heating device configured to heat and decompose the silicon carbide raw material gas;

a pressure sensor configured to measure a gas pressure of the supply gas; and a computing device configured to perform a prediction of a clogging time, which is a time until the gas introduction pipe is clogged with a solid deposit, based on the gas pressure measured by the pressure sensor and a learning model created by machine learning using data calculated from results of simulations of growing the silicon carbide single crystal and results of experiments of growing the silicon carbide single crystal.

2. The silicon carbide single crystal manufacturing apparatus according to claim 1, wherein the pressure sensor is:

disposed at a position inside the gas introduction pipe located upstream of the gas outlet in a flow direction of the supply gas; and configured to measure the gas pressure inside the gas introduction pipe.

3. The silicon carbide single crystal manufacturing apparatus according to claim 1, wherein the computing device is further configured to:

calculate, based on the prediction of the clogging time, an optimal process for lengthening the clogging time when growing the silicon carbide single crystal; and output the optimal process.

4. The silicon carbide single crystal manufacturing apparatus according to claim 1, wherein the computing device is further configured to:

calculate, based on the prediction of the clogging time, at least one condition that is selected from a group consisting of a type of a gas in the supply gas, a flow rate of the supply gas, and a temperature of the reaction chamber, and that lengthens the clogging time when growing the silicon carbide single crystal; and output the at least one condition.

5. A computing device for a silicon carbide single crystal manufacturing apparatus, comprising a processor and a memory that stores instructions configured to, when executed by the processor and when growing a silicon carbide single crystal using the silicon carbide single crystal manufacturing apparatus in such a manner that a seed crystal is disposed on one surface of a pedestal arranged in a hollow portion of a crucible having a cylindrical shape and constituting a reaction chamber, a supply gas containing a silicon carbide raw material gas is introduced into the crucible from a gas outlet of a gas introduction pipe below the pedestal, and the silicon carbide raw material gas is thermally decomposed and supplied to a surface of the seed crystal to grow the silicon carbide single crystal, cause the processor to:

acquire a gas pressure of the supply gas measured by a pressure sensor; and perform a prediction of a clogging time, which is a time until the gas introduction pipe is clogged with a solid deposit, based on the gas pressure measured by the pressure sensor and a learning model created by machine learning using data calculated from results of simulations of growing the silicon carbide single crystal and results of experiments of growing the silicon carbide single crystal.

6. The computing device according to claim 5, wherein the pressure sensor is configured to measure the gas pressure at a position inside the gas introduction pipe located upstream of the gas outlet in a flow direction of the supply gas.

7. The computing device according to claim 5, wherein the instructions are configured to, when executed by the processor, further cause the processor to:

calculate, based on the prediction of the clogging time, an optimal process for lengthening the clogging time when growing the silicon carbide single crystal; and output the optimal process.

8. The computing device according to claim 5, wherein the instructions are configured to, when executed by the processor, further cause the processor to:

calculate, based on the prediction of the clogging time, at least one condition that is selected from a group consisting of a type of gas in the supply gas, a flow rate of the supply gas, and a temperature of the reaction chamber, and that lengthens the clogging time when growing the silicon carbide single crystal; and and output the at least one condition.

9. A manufacturing method of a silicon carbide single crystal, comprising:

growing a silicon carbide single crystal using a silicon carbide single crystal manufacturing apparatus by disposing a seed crystal on one surface of a pedestal arranged in a hollow portion of a crucible having a cylindrical shape and constituting a reaction chamber, introducing a supply gas containing a silicon carbide raw material gas into the crucible from a gas outlet of a gas introduction pipe below the pedestal, and thermally decomposing and supplying the silicon carbide raw material gas to a surface of the seed crystal;

measuring a gas pressure of the supply gas with a pressure sensor; and perform a prediction of a clogging time, which is a time until the gas introduction pipe is clogged with a solid deposit, based on the gas pressure measured by the pressure sensor and a learning model created by machine learning using data calculated from results of simulations of growing the silicon carbide single crystal and results of experiments of growing the silicon carbide single crystal.

10. The manufacturing method according to claim 9, wherein the measuring with the pressure sensor includes measuring the gas pressure at a position inside the gas introduction pipe located upstream of the gas outlet in a flow direction of the supply gas.

11. The manufacturing method according to claim 9, further comprising:

calculating, based on the prediction of the clogging time, an optimal process for lengthening the clogging time when growing the silicon carbide single crystal; and outputting the optimal process.

12. The manufacturing method according to claim 9, further comprising:

calculating, based on the prediction of the clogging time, at least one condition that is selected from a group consisting of a type of gas in the supply gas, a flow rate of the supply gas, and a temperature of the reaction chamber, and that lengthens the clogging time when growing the silicon carbide single crystal; and feeding back the at least one condition, wherein the growing of the silicon carbide single crystal includes growing the silicon carbide single crystal based on the at least one condition that is fed back.

* * * * *